Oct. 7, 1969 R. KAPPELMEYER ET AL 3,471,326
METHOD AND APPARATUS FOR EPITAXIAL DEPOSITION
OF SEMICONDUCTOR MATERIAL
Filed Nov. 1, 1965

United States Patent Office 3,471,326
Patented Oct. 7, 1969

3,471,326

METHOD AND APPARATUS FOR EPITAXIAL DEPOSITION OF SEMICONDUCTOR MATERIAL

Rudolf Kappelmeyer, Oberhaching, near Munich, and Kurt Schlüter and Hermann Steggewentz, Munich, Germany, assignors to Siemens Aktiengesellschaft, Berlin, Germany, a corporation of Germany Filed Nov. 1, 1965, Ser. No. 505,780
Claims priority, application Germany, Nov. 2, 1964, S 93,998
Int. Cl. C23c *13/02*; H01b *3/02*
U.S. Cl. 117—228 12 Claims

ABSTRACT OF THE DISCLOSURE

Described is a method and apparatus for epitaxially precipitating semiconductor material from a gaseous phase onto monocrystalline semiconductor substrates heated to the precipitation temperature by being placed upon a heating element traversed by electric heating current. The improvement in the method comprises placing the substrates on top of the heating element, and supplying the electric current to the heating element to maintain the substrates at precipitation temperature and radiating as much heat to the bottom side of the heating element per unit area and unit time as corresponds to the simultaneous heat loss by radiation from said heating element bottom side. Apparatus for carrying out the method is also disclosed.

Our invention relates to the epitaxial deposition of semiconductor material on monocrystalline discs or other substrate wafers.

Epitaxy is being frequently used in the production of semiconductor components for electronic and other purposes. The method comprises heating the crystalline substrates to a high temperature below the melting point of the semiconductor material and bringing a reaction gas, preferably mixed with pure hydrogen, into contact with the hot substrate, the reaction gas being thermally dissociable to evolve the semiconductor material to be deposited upon the substrate.

The semiconductor substrates have been placed upon a strip-shaped carrier of electrically conductive and thermally as well as chemically stable material, such as graphite or other carbon, serving as a heat source. During deposition, the carrier strip is traversed by an electric current whose intensity is adjusted to heat the substrates, directly contacting the carrier, to the high temperature required for the epitaxial deposition process. As a rule, the reaction gas used is a mixture of hydrogen with a volatile halogenide of the semiconductor material. For germanium epitaxy, for example, the compounds $GeCL_4$, $GeCL_2$, $GeHCL_3$, or the corresponding bromine or iodine compounds, may thus be employed. Epitaxy in general, and hence also the method according to the present invention, are also applicable with other semiconductor materials, such as silicon, silicon carbide and $A^{III}B^{V}$ semiconductor compounds.

It is an object of our invention to improve the uniformity of the layer thickness for improving the electrical properties of the surface layers or films epitaxially grown on a number of substrates simultaneously, thus securing a better degree of uniformly good qualities in the resulting products.

Another, more specific object of our invention is to secure a more uniform temperature distribution among a number of substrates on which an epitaxial layer or film is being grown simultaneously.

Still another object of the invention is to reduce the possibility of undesired impurities entering into the surface layers as they are being grown on the substrates.

A further object of the invention is to secure high-quality epitaxial layers, for example of accurately planar rather than convex or concave configuration, while nevertheless affording a relative rapid performance and completion of the epitaxial deposition process and requiring a relatively low amount of energy in comparison with known methods and apparatus.

According to our invention, the above-described general method of epitaxially precipitating semiconductor material from a gaseous phase onto monocrystalline semiconductor substrates heated to the precipitation temperature by being placed upon a carrier traversed by electric heating current, is improved by supplying the electric heating current to the carrier through a heat-radiating conductor which we place beneath the carrier and which we dimension to radiate to the botom side of the carrier aproximately the same amount of heat per unit area and unit time as corresponds to the simultaneous heat loss by radiation from the carrier bottom side. Preferably we place a number of substrates on top of the carrier into respective recesses which substantially match the substrates with respect to cross section and height.

According to another feature of our invention, we design the carrier as a strip-shaped structure and in such a manner that a number of the above-mentioned recesses can be simultaneously charged with semiconductor discs or substrates. These recesses are preferably arranged in a row extending parallel to the longitudinal axis of the carrier.

According to still another feature of our invention, care is taken to supply the reaction gas to the carrier in uniform distribution, at least along the carrier portion where the substrates are located. This is achieved in a particularly effective and simple manner by branching the fresh gas supply line into two outlet pipes located on diametrically opposite sides of the reaction vessel, particularly at the right and at the left of the carrier so as to extend horizontally and parallel to the longitudinal direction of the carrier. Each of the two branch pipes is provided with two rows of outlet openings along respective longitudinal or generatrix lines, so that the reaction gas issues substantially in a direction tangential to the wall of the reaction vessel. Preferably the vessel is given the shape of a cylinder with a circular cross section, the vessel axis extending horizontally. When employing a carrier whose top side, with the exception of the recesses for the substrate, is planar, this top side is preferably so mounted that all straight lines possible in the planar portion of the top side are horizontal during the precipitation process.

The invention will be further described with reference to embodiments of apparatus according to the invention illustrated by way of example on the accompanying drawing in which.

The method of the invention can be realized in a simple and reliable manner if the portion of the electric current supply lead to be located beneath the substrate carrier is substantially identical with the carrier with respect to material and dimensions. This particularly requires giving both the carrier and the radiating conductor portion the same shape. It is preferable to have the carrier and the just-mentioned conductor portion both shaped as straight and flat strips which extend parallel to each other within the reaction vessel.

Figure 1:
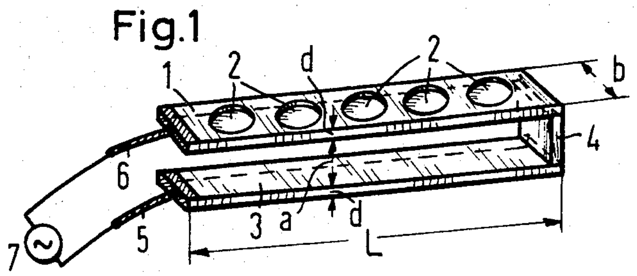
FIG. 1 shows in schematical perspective a first embodiment of a carrier-conductor assembly for heating a number of substrates.

An assembly of the kind just mentioned is shown in FIG. 1. The carrier strip 1 consisting of graphite or other carbon material extends horizontally and has circular recesses 2 in its top face for receiving respective circular substrate discs. A likewise strip-shaped conductor portion 3 extends beneath the carrier 1 in parallel relation thereto and has the same over-all dimensions as the carrier. The conductor portion 3 forms part of one of the leads for passing heating current through the carrier 1. To this end the carrier 1 and the conductor 3 are electrically connected with each other at one end by a conductor piece 4 of the same material which preferably has the same thickness and the same width as the strips 1 and 3. Further leads 5 and 6 connect the assembly to the source 7 of heating current.

The above-stated objects of the invention make it desirable to keep the spacing *a* between the carrier 1 and the conductor portion 3 as small as possible. For that reason, the distance between carrier and conductor portion 3 is preferably made as small as feasible without short-circuiting the connecting piece 4 of the assembly. The interspace between the carrier strip 1 and the conductor portion 3 beneath the carrier is either kept vacant or is filled with quartz. The conductor portion 3 is not employed as a carrier for substrates.

The carrier 1 and the conductors 3 and 4 preferably constitute a single integral structure produced from a single piece of graphite or other carbon.

A further improvement toward better uniformity of temperature distribution can be achieved by tapering both ends of the carrier 1 and preferably also both ends of the conductor portion 3 located beneath the carrier and in heat-exchanging relation thereto. The increased heat losses occurring at the ends can thus be compensated by an augmented local heating.

Figures 2, 3:
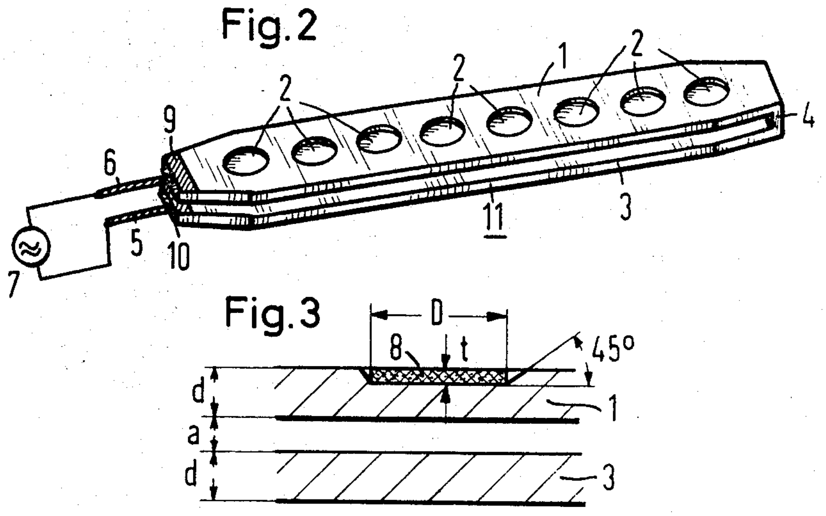
FIG. 2 shows in a corresponding manner another embodiment of a carrier-conductor assembly for heating substrates.
FIG. 3 is a schematic cross-sectional illustration in a plane transverse to the longitudinal direction of the assembly shown in FIG. 1 or FIG. 2.

An embodiment of the type just mentioned is shown in FIG. 2. The carrier 1 proper and the conductor portions 3 and 4 are combined to a single body 11 whose ends 9 and 10 are connected through respective leads 6 and 5 to the source 7 of heating current. The top side of the carrier strip 1 is provided with recesses 2. Both ends of the carrier and of the conductor portion 3 are shaped to a taper down to approximately 10 to 40% of the normal width of the strips.

The features just described contribute to improving the uniformity and temperature distribution at the top side of the carrier and thus to also improving the uniformity of the deposition, resulting in better electrical properties of the epitaxial layer. Also of importance to these results is the design of the recesses 2 for receiving the substrates. The base of the recesses corresponds to that of each substrate, and the depth is such that the top face of each substrate lies flush at least approximately with the top plane of the carrier. It is further advisable to have the lateral wall of each recess extend at an angle with respect to the top face of the carrier and the bottom of the recess. Particularly advantageous is an angle of about 45° so that the recess is slightly wider at the top plane than at the recess bottom.

The desirable configuration is apparent from FIG. 3. The top face of the carrier 1 is shown to have a recess which receives a circular substrate disc 8. It will be seen that the top face of the disc 8 is flush with the upper edge of the recess 2 and that a clearance is provided by the inclination of the recess side wall. This recess is kept very small so that it will not interfere with the desired uniformity of epitaxial growth but suffices to facilitate removal of the substrate upon completion of the deposition.

To secure best feasible purity of the precipitating material, it is often advisable to have the carrier and all other types of conducting material, such as carbon or metal, in the processing apparatus coated with particularly stable and pure coating material. For example, coatings of highly pure silicon dioxide ($SiO_2$) deposited on the surface of the carrier and of all other parts serving to conduct electric current, greatly promote utmost purity of the precipitated semiconductor material. When using such protective coatings, the recesses 2 at the top side of the carrier extend at least partially in or through the coating material so that the heating of the carrier is effected not by direct but rather by indirect contact with the heated carrier.

If the coating consists of $SiO_2$ material such as quartz, or of another good heat conducting material, it is sufficient if the recesses for receiving the substrate extend only into the coating material. In this case the top face of the carrier 1 becomes particularly smooth, so that a sheath can be shoved over the carrier and withdrawn therefrom. Such a coating is preferably designed as a rectangular sleeve closed at one end which simultaneously is pulled over the conductor portions 3 and 4 of an assembly according to FIG. 1 or FIG. 2 from the side of conductor piece 4.

Figure 4:
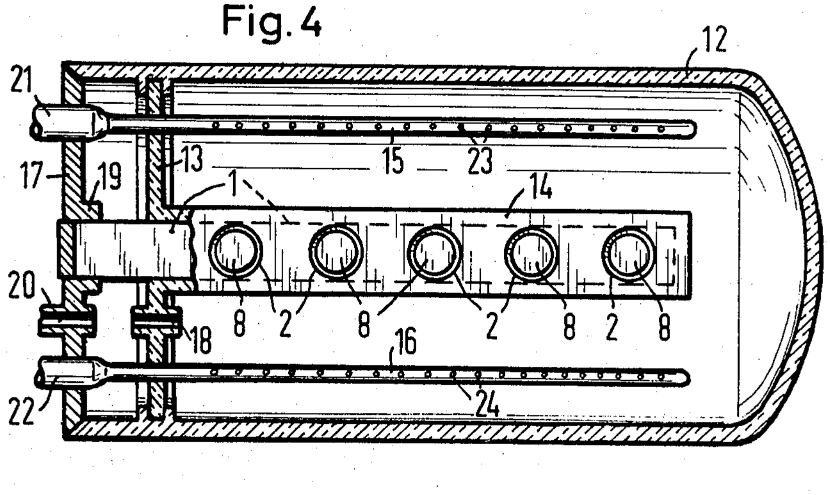
FIG. 4 illustrates, partly in section, a horizontally mounted processing vessel according to the invention seen from above.

The just-mentioned features are embodied in the apparatus shown in FIG. 4 and described presently.

The apparatus shown in FIG. 4 comprises an elongated cylindrical reaction vessel of bell shape consisting of quartz and mounted horizontally. The opening of the quartz bell at the left is closed by a quartz disc 13 and by a rectangular sleeve 14 of quartz which is joined with the quartz disc 13 and extends from the center of the disc 13 into the interior of the bell 12. Two gas supply pipes 15 and 16, likewise consisting of quartz, extend from the outside through the quartz disc 13 into the bell space on opposite sides respectively of the rectangular sleeve 14 and in parallel relation thereto. When the apparatus is in operation, the two pipes 15 and 16 supply the reaction gas to the substrate 8 in parallel operation. The quartz disc 13 is further provided with an outlet 18 for the spent reaction gas.

For receiving the substrate discs 8, the top side of the prismatic quartz sleeve 14 is provided with recesses 2 in its top wall. These recesses are dimensioned in accordance with the viewpoints explained above with reference to FIGS. 1 to 3. The carrier 1 with its electrical supply conductor 3, corresponding to FIGS 1 to 3, extends in the interior of the rectangular quartz sleeve 14, but no recesses in the top face of the strip-shaped carrier 1 are necessary; because these recesses are provided in the sleeve 14 tightly surrounding the carrier 1.

The quartz bell 12 protrudes to the left beyond the closure disc 13 and has its outer end covered by a plate 17 consisting, for example, of metal. Mounted in the closure plate 17 are holders 19 for the carrier 1 and its current supply lead and hence for the parts denoted by 1 and 3 in FIG. 1 or FIG. 2. The electrical supply leads 5 and 6 also extend through the plate 17 to the carrier or heater 1 in the interior of the quartz sleeve 14 into whose recesses the substrates are place, it being understood that the heating carrier 1 is electrically insulated from the conductor portion 3 with which the carrier is in heat-exchanging relation. The closure plate 19 has an outlet 20 for the spent reaction gasses and passages 21 and 22 for the respective gas supply pipes 15 and 16.

It will be seen from the top view presented in FIG. 4 that the two gas supply pipes 15 and 16 are located on opposite sides of the quartz sleeve 14 and extend beside the sleeve along the distance to be occupied by substrates 8. Each gas supply pipe has a series of openings 23, 24 along the top as well as along the bottom, through which openings the fresh reaction gas enters into the vessel. The gas therefore issues from the conduits in a direction tangential to the inner wall surface of the reaction space. This is particularly favorable for a uniform growth of the epitaxial layer upon the row of substrates located between and along the two gas supply pipes.

The use of the sleeve 14, or of a use of corresponding sheath of $SiO_2$ fixedly deposited upon the carrier and upon the current conducting parts within the precipitating vessel, shields the substrates to an appreciable extent from ingress of substances that may contaminate the semiconductor material to a stronger degree than $Si_2O$ or quartz. For best feasible purity of the semiconductor material being produced, a reaction vessel made of quartz in which the reaction space, aside from the substrate, is bordered only by quartz but by no other solid material, has been found particularly advantageous even in the production of epitaxial films on silicon.

Examples of suitable dimensions will now be described with reference to FIGS. 2 and 3. The length of the carrier 1 and the conductor 3 is L=28 to 30 cm., the width $b$ of both parts is 3 cm., the thickness $d$=0.3 cm., the spacing $a$ between carrier 1 and conductor 3 is 0.3 cm. In FIG. 3, D denotes the diameter of the substrate disc and $t$ the height of the substrates corresponding to the depth of the recesses provided in the top side of the carrier or of the surrounding quartz sleeve (FIG. 4).

In individual cases, particularly if the epitaxial films are to be extremely thin, the above-described recesses in the carrier or the quartz sleeve may be dispensed with.

The above-described embodiments of apparatus according to the invention are particularly favorable because they afford constrainedly realizing the desired performance with an especially simple construction of the carrier 1 and of the conductor 3. However, there are other ways of performing the method according to the invention. One of these is to provide for the required radiation equilibrium between the bottom side of the carrier and the conductor portion in heat exchanger relation thereto, by giving these two parts respectively different dimensions and shapes. Still another way of achieving the same result is to place heat insulation means in the space between carrier and conductor portion 3. The radiation equilibrium may further be secured by optical reflecting means and by differently heating the supply leads and the carrier respectively. The advantages of such means may also be employed for example in apparatus as illustrated in FIG. 4. Thus, the side walls of the quartz sleeve 14, or if desired also its bottom wall, may be provided on the inner side with an inwardly reflecting mirror coating whereby lateral heat losses can be greatly reduced.

The advantages of the invention mainly reside in securing a uniform heating of the substrates, avoiding the occurrence of convex or concave epitaxial layers, and affording a relatively rapid completion of the deposition process for a given energy consumption. An apparatus of the type exemplified in FIG. 4 further provides for maximal freedom of the deposited epitaxial layer from undesired impurities, particularly because the electrical connections, holders, and sealed openings of the vessel, are all located at the same side and virtually at the same locality of the equipment, thus permitting an effective shielding of the reaction space from this locality.

It is sometimes desirable to have the substrates in direct contact with the carrier along the margin only, or only at the center. The directly contacting localities of the substrate are in direct heat conducting contact with the carrier and consequently are more strongly heated than other localities not directly touching the carrier. Consequently, this affords a means of heating more strongly either the marginal area or the center of the substrate discs. A more strong heating at the margin is desirable with concave discs or planer discs because experience has shown that such discs remain cooler at the margin when subjected to a uniform supply of heat. On the other hand, convex discs are sometimes preferably heated more strongly at the center than at the margin.

We claim:

1. In the method of epitaxially precipitating semiconductor material from a gaseous phase onto monocrystalline semiconductor substrates heated to the precipitation temperature by being placed upon a heating element traversed by electric heating current, the improvement which comprises placing the substrates on top of the heating element, and supplying the electric current to the heating element to maintain the substrates at precipitation temperature and radiating as much heat to the bottom side of the heating element per unit area and unit time as corresponds to the simultaneous heat loss by radiation from said heating element bottom side.

2. Apparatus for epitaxially precipitating semiconductor material from a gaseous phase onto substrates, comprising a reaction vessel having gas supply means and gas outlet means, a flat strip-shaped carrier horizontally mounted in said vessel and having a top face for accommodating the substrates, a flat strip-shaped heat-radiating conductor extending horizontally beneath and parallel to said carrier in heat-exchanging relation thereto, said conductor being connected in series with said carrier, and circuit leads for passing heating current from the outside of said vessel through said carrier and conductor, said conductor being rated to radiate to the bottom side of the carrier approximately the same amount of heat per unit area and unit time as corresponds to the simultaneous heat loss by radiation from said carrier bottom side, the ratio of the distance between said carrier and said couductor to their width being at most 0.3:30.

3. In apparatus according to claim 2, said strip-shaped carrier having in its top face a row of recesses matching the substrates in cross section and height.

4. In apparatus according to claim 3, said recesses having a depth and a bottom area substantially equal to the height and cross section of the substrates, and having a side wall outwardly inclined about 45° toward the horizontal top side.

5. In apparatus according to claim 2, said gas supply means comprising two pipes extending horizontally on opposite sides respectively of said carrier and having rows of gas outlet openings positioned for issuance of the reaction gas in a direction substantially tangential to said reaction vessel.

6. Apparatus according to claim 2, said carrier and said conductor consisting of the same material and having substantially the same shape and dimensions, and an intermediate conductor piece connecting one end of said carrier with the adjacent end of said conductor.

7. In apparatus according to claim 6, said carrier and conductor and intermediate piece forming jointly a single integral body.

8. In apparatus according to claim 2, said carrier and said conductor being sheathed with heat-resistant and chemically inert material.

9. In apparatus according to claim 8, said sheath material being a coating of silicon dioxide.

10. Apparatus according to claim 2, comprising a sleeve of quartz in which said strip-shaped carrier and conductor are located, said sleeve having a top wall in proximity to the top face of said carrier.

11. In apparatus according to claim 10, said top wall having on its top side a row of recesses for receiving the respective substrates.

12. In apparatus according to claim 11, said recesses in said sleeve having a depth and a bottom area substantially equal to the height and cross section of the substrates, and having a side wall outwardly inclined about 45° toward the horizontal top side of said sleeve.

References Cited

UNITED STATES PATENTS

| | | | |
|---|---|---|---|
| 3,131,098 | 4/1964 | Krsek et al. | 118—49.5 X |
| 3,220,380 | 11/1965 | Schaarschmidt | 118—48 |
| 3,329,527 | 7/1967 | Harris. | |

FOREIGN PATENTS

| | | |
|---|---|---|
| 938,699 | 10/1963 | England. |

WILLIAM L. JARVIS, Primary Examiner

U.S. Cl. X.R.

23—223.5; 117—106, 201; 118—48; 219—19